United States Patent
Song

(10) Patent No.: US 9,733,949 B2
(45) Date of Patent: Aug. 15, 2017

(54) SEMICONDUCTOR DEVICE CAPABLE OF MONITORING INTERNAL SIGNAL AND METHOD FOR DRIVING THE SAME

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 224 days.

(21) Appl. No.: 14/686,467

(22) Filed: Apr. 14, 2015

(65) Prior Publication Data

US 2016/0162300 A1 Jun. 9, 2016

(30) Foreign Application Priority Data

Dec. 8, 2014 (KR) .................. 10-2014-0174943

(51) Int. Cl.
*G11C 5/00* (2006.01)
*G06F 9/44* (2006.01)
*G06F 11/00* (2006.01)

(52) U.S. Cl.
CPC ............ *G06F 9/4403* (2013.01); *G11C 5/005* (2013.01); *G06F 11/00* (2013.01)

(58) Field of Classification Search
CPC ........ G06F 9/4403; G06F 11/00; G11C 5/005
See application file for complete search history.

(56) References Cited

U.S. PATENT DOCUMENTS

| | | | | |
|---|---|---|---|---|
| 7,826,296 B2* | 11/2010 | Kim | ............... | G11C 17/16 365/189.06 |
| 9,104,571 B2* | 8/2015 | Ku | ............... | G06F 11/0772 |
| 2009/0168580 A1* | 7/2009 | Kim | ............... | G11C 17/16 365/225.7 |
| 2009/0168581 A1* | 7/2009 | Im | ............... | G11C 17/18 365/225.7 |
| 2014/0050037 A1* | 2/2014 | Kim | ............... | G11C 7/1078 365/189.15 |
| 2014/0185356 A1* | 7/2014 | Cha | ............... | G11C 17/16 365/96 |

FOREIGN PATENT DOCUMENTS

KR 1020020017278 3/2002

* cited by examiner

*Primary Examiner* — Khamdan Alrobaie
(74) *Attorney, Agent, or Firm* — IP & T Group LLP

(57) ABSTRACT

A semiconductor device includes an internal signal processing block suitable for generating an internal enable signal and an internal control signal that correspond to an external enable signal and an external control signal, and a monitoring unit suitable for outputting a monitoring signal that corresponds to a predetermined internal signal, based on the internal enable signal and the internal control signal, in an initial operation period.

20 Claims, 5 Drawing Sheets

SEMICONDUCTOR DEVICE CAPABLE OF MONITORING INTERNAL SIGNAL AND METHOD FOR DRIVING THE SAME

CROSS-REFERENCE TO RELATED APPLICATIONS

The present application claims priority of Korean Patent Application No. 10-2014-0174943, filed on Dec. 8, 2014, which is incorporated herein by reference in its entirety.

BACKGROUND

1. Field

Exemplary embodiments of the present invention relate to a semiconductor design technology and, more particularly, to a semiconductor device having a monitoring function and a method for driving the same.

2. Description of the Related Art

FIG. 1 is a block diagram illustrating a conventional semiconductor device 100.

Referring to FIG. 1, the semiconductor device 100 includes an internal signal processing block 110, a command decoding block 120, a memory block 130, an output block 140, a fuse block 150, and an internal voltage generation block 160.

The internal signal processing block 110 generates internal signals CID[1:0], ICKE, ICSB, ICMDs, and IADD[#:0] that correspond to external signals C[1:0], CKE, CSB, CMDs, ADD[#:0], CLK, and CLKB transferred from an external device (not illustrated). The command decoding block 120 decodes some ICK, ICSB, and ICMDs of the internal signals generated from the internal signal processing block 110. The memory block 130 performs a write operation and a read operation in response to some IADD[#:0], etc of the internal signals generated from the internal signal processing block 110 and some internal control signals ACT, PRE, RD, WT, etc decoded from the command decoding block 120. The output block 140 provides read data NOMAL_DATA[63:0] read from the memory block 130 to the external device through first to eighth data pads DQ0 to DQ7 in response to a data width option signal X8.

The internal signal processing block 110 includes circuits for processing the external signals C[1:0], CKE, CSB, CMDs, ADD[#:0], CLK, and CLKB according to internal characteristics. The external signals C[1:0], CKE, CSB, CMDs, ADD[#:0], CLK, and CLKB include chip identification signals C[1:0], a clock enable signal CKE, command signals CMDs, address signals ADD[#:0], and differential clock signals CLK and CLKB, wherein the external signals C[1:0], CKE, CSB, CMDs, ADD[#:0], CLK, and CLKB will be named as the signals for this description.

For example, the internal signal processing block 110 includes input units RxS, a clock transfer unit, delay units tIS/tIH, and synchronization units F/F. The input units RxS buffer the chip identification signals C[1:0], the clock enable signal CKE, the command signals CMDs, the address signals ADD[#:0], and the differential clock signals CLK and CLKB. The clock transfer unit transfers an internal clock signal CLK', which is outputted from any one of the input units RxS, to a predetermined path. The delay units tIS/tIH adjust the setup and hold times of internal chip identification signals C'[1:0], an internal clock enable signal CKE', internal command signals CMDs', and internal address signals ADD'[#:0] which are outputted from the other input units RxS. The synchronization units F/F synchronize signals outputted from the delay units tIS/tIH with a clock signal outputted from the clock transfer unit.

The command decoding block 120 combines some ICKE, ICSB, and ICMDs of the signals outputted from the internal signal processing block 110, and generates internal control signals SREF, REF, PDEN, ACT, PRE, RD, WT, MRS, ZQC, etc.

The memory block 130 outputs stored write data as the read data NOMAL_DATA[63:0] in a read operation. Particularly, the memory block 130 decides the amount of data to be outputted at a time according to a data width option mode. For example, the memory block 130 simultaneously outputs read data NOMAL_DATA[31:0] and NOMAL_DATA[63:32] of first and second groups in an X8 mode, and simultaneously outputs the read data NOMAL_DATA[31:0] of the first group between the read data NOMAL_DATA[31:0] and NOMAL_DATA[63:32] of the first and second groups in an X4 mode.

The output block 140 outputs some or all of the read data NOMAL_DATA[63:0] to the first to eighth data pads DQ0 to DQ7 according to a data width option signal X8 in the read operation. For example, the output block 140 includes a first output driving unit 141 that outputs the read data NOMAL_DATA[31:0] of the first group to the first to fourth data pads DQ0 to DQ3 regardless of the data width option signal X8 in the read operation, and a second output driving unit 143 that outputs the read data NOMAL_DATA[63:32] of the second group to the fifth to eighth data pads DQ4 to DQ7 according to the data width option signal X8 in the read operation.

The fuse block 150 is used for repairing the memory block 130. The internal voltage generation block 160 generates internal voltages used for the operations of the memory block 130, the fuse block 150, etc.

FIG. 2 is a timing diagram for describing an operation of the semiconductor device 100 shown in FIG. 1.

Referring to FIG. 2, the semiconductor device 100 performs an initialization operation for an initialization period R after a power-up period, and performs a boot-up operation for a boot-up period B after the initialization period R. For example, the semiconductor device 100 initializes the logic values of logic circuits, requiring an initialization operation for the initialization period R, to a default value, loads fuse signals programmed in the fuse block 150 for the boot-up period B, and generates an internal voltage through the internal voltage generation block 160.

The power-up period includes a period in which a power supply voltage VDD is ramped to a target level, the initialization period R includes a period in which a reset signal RESET_n inputted from an external device is activated to a logic low level, and the boot-up period B includes a period from the time point at which the reset signal RESET_n is deactivated to a logic high level to the time point at which the clock enable signal CKE is activated to a logic high level.

Then, the semiconductor device 100 performs a predetermined operation for a normal period after the boot-up period B in response to the command signals CMDs and the address signals ADD[#:0]. For example, the semiconductor device 100 outputs the first to 32$^{th}$ read data NOMAL_DATA[31:0] through the first to fourth data pads DQ0 to DQ3, except for the fifth to eighth data pads DQ4 to DQ7, for the normal period. This describes the case in which the data width option of the semiconductor device 100 is set as the X4 mode, that is, the case in which the first output driving unit 141 is enabled and the second output driving unit 143 is disabled. Of course, when the data width option is set as the X8 mode, all the first and second driving units 141 and 143 are enabled to output the first to $64^{th}$ read data NOMAL_DATA[63:0] through the first to eighth data pads DQ0 to DQ7.

The semiconductor device 100 may be controlled to perform a predetermined operation at a predetermined timing.

However, the semiconductor device 100 has the following concerns.

The semiconductor device 100 may receive the command signals CMDs only after the dock enable signal CKE is activated to a logic high level. This is because the differential clock signals CLK and CLKB may be inputted after the time point at which the clock enable signal CKE is activated to the logic high level.

Meanwhile, the semiconductor device 100 performs the initialization operation or the boot-up operation when the clock enable signal CKE is in an undefined state or a deactivated state. In the initialization period R, the clock enable signal CKE is in the undefined state, and in the boot-up period B, the clock enable signal CKE is in the deactivated state.

When the semiconductor device 100 performs the initialization operation or the boot-up operation, it is not easy to analyze failures caused by the initialization operation or the boot-up operation. This is because the command signals CMDs may not be inputted for the initialization period R and the boot-up period B.

That is, in the semiconductor device 100, since the input of the command signals CMDs is not allowed for the initialization period R and the boot-up period B, internal signals related to the initialization operation and the boot-up operation may not be monitored.

SUMMARY

Various embodiments are directed to a semiconductor device capable of monitoring internal signals related to an initialization operation and a boot-up operation, and a method for driving the same.

In an embodiment, a semiconductor device may include an internal signal processing block suitable for generating an internal enable signal and an internal control signal that correspond to an external enable signal and an external control signal; and a monitoring unit suitable for outputting a monitoring signal that corresponds to a predetermined internal signal, based on the internal enable signal and the internal control signal, in an initial operation period.

The initial operation period may include an initialization period and/or a boot-up period, which are subsequent to a power-up period.

The semiconductor device may further include: an internal voltage generation block suitable for generating an internal voltage corresponding to an operation control signal, wherein the internal voltage generation block is initialized based on a power-up signal; and a fuse block suitable for outputting a predetermined fuse signal based on a boot-up signal, wherein the internal signal includes one of the power-up signal.

The internal signal may include one of the power-up signal, the operation control signal, the boot-up signal, and the fuse signal.

the monitoring unit may output the monitoring signal based on the internal enable signal and the internal control signal, in a normal operation period after the initial operation period.

In an embodiment, a semiconductor device may include: a first pad suitable for selectively outputting a monitoring signal and a data signal; and a monitoring unit suitable for outputting a first internal signal to be monitored as the monitoring signal, in an initial operation period.

The initial operation period may include an initialization period and/or a boot-up period, which are subsequent to a power-up period.

The monitoring unit may output the monitoring signal to the pad or outputs the data signal corresponding to a second internal signal to the pad based on a data width option signal, in a normal operation period after the initial operation period.

The semiconductor device may further include: a memory block.

The second internal signal includes a data signal stored in the memory block.

The semiconductor device may further include: a second pad suitable for receiving an external enable signal; at least one third pad suitable for receiving at least one external control signal; and an internal signal processing block suitable for generating an internal enable signal and an internal control signal that correspond to the external enable signal and the external control signal.

The monitoring unit may include: a selection circuit suitable for selecting any one of the first and second internal signals based on the internal enable signal and the internal control signal, and generating a pre-output signal; and an output circuit suitable for outputting the pre-output signal as the monitoring signal or the data signal based on the internal enable signal and the data width option signal.

The first internal signal may include internal signals.

The selection circuit may include: a first selection section suitable for sequentially outputting the internal signals as an internal output signal based on the internal control signal; and a second selection section suitable for selecting any one of the internal output signal and the second internal signal based on the internal enable signal, to output the selected signal as the pre-output signal.

The output circuit may include: an output control section suitable for generating an output control signal based on the internal enable signal and the data width option signal; and an output driving section suitable for outputting the pre-output signal as the monitoring signal or the data signal based on the output control signal.

The internal signal processing block may include: a first buffer unit suitable for buffering the external enable signal to generate the internal enable signal; a second buffer unit suitable for buffering the external control signal to generate a pre-control signal; and an internal operation signal processing unit suitable for outputting the pre-control signal as the internal control signal based on the internal enable signal.

The semiconductor device may further include: an internal voltage generation block suitable for generating an internal voltage based on an operation control signal, wherein the internal voltage generation block is initialized based on a power-up signal; and a fuse block suitable for outputting a predetermined fuse signal based on a boot-up signal.

The first internal signal may include one of the power-up signal, the operation control signal, the boot-up signal, and the fuse signal.

In an embodiment, a method for driving a semiconductor device may include: receiving an external enable signal and an external control signal in a specific operation period in which a clock enable signal is in an undefined state or a deactivated state; and outputting a monitoring signal that corresponds to an internal signal based on the external enable signal and the external control signal, in the specific operation period.

The specific operation period may include an initialization operation and/or a boot-up operation, and the internal signal relates to one of the initialization operation and the boot-up operation.

The method may further include: setting a data width option mode; and selectively outputting the monitoring signal and a data signal through a common output path based on the data width option mode, in a normal operation period other than the specific operation period.

When the data width option mode is set to have a maximum data width, the semiconductor device may output the data signal through the common output path in the normal operation period.

When the data width option mode is set to have a non-maximum data width, the semiconductor device may output the monitoring signal through the common output path, in the normal operation period.

The semiconductor device may output the monitoring signal through the common output path in the specific operation period.

DETAILED DESCRIPTION

Figure 1:
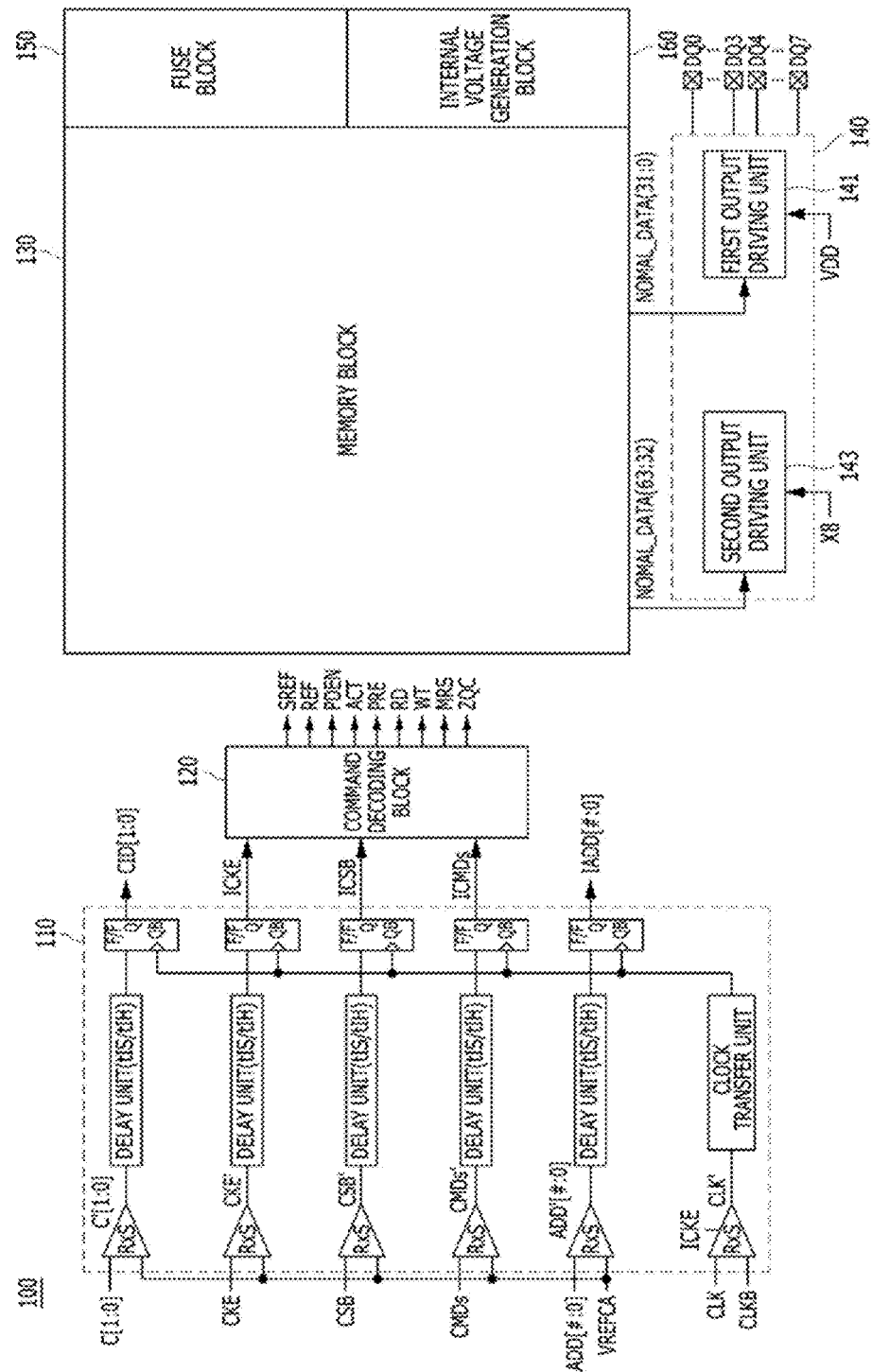
FIG. 1 is a block diagram illustrating a conventional semiconductor device.
Figure 2:
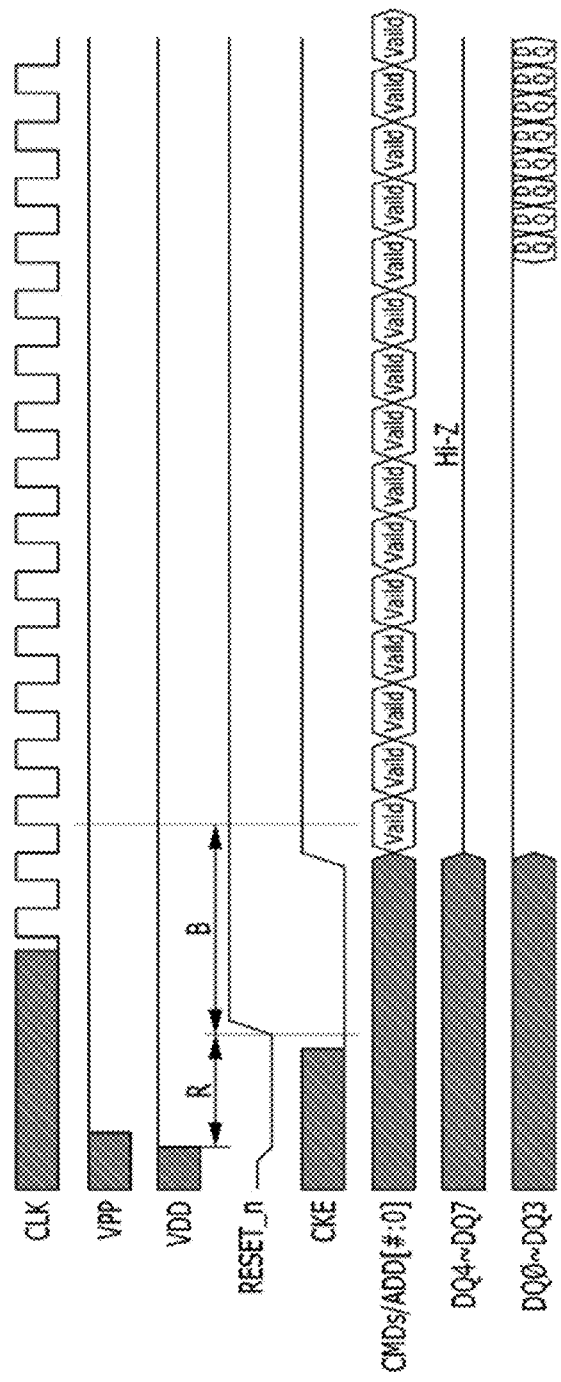
FIG. 2 is a timing diagram for describing an operation of the semiconductor device shown in FIG. 1.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to where the first layer is formed directly on the second layer or the substrate but also to where a third layer exists between the first layer and the second layer or the substrate.

Figure 3:
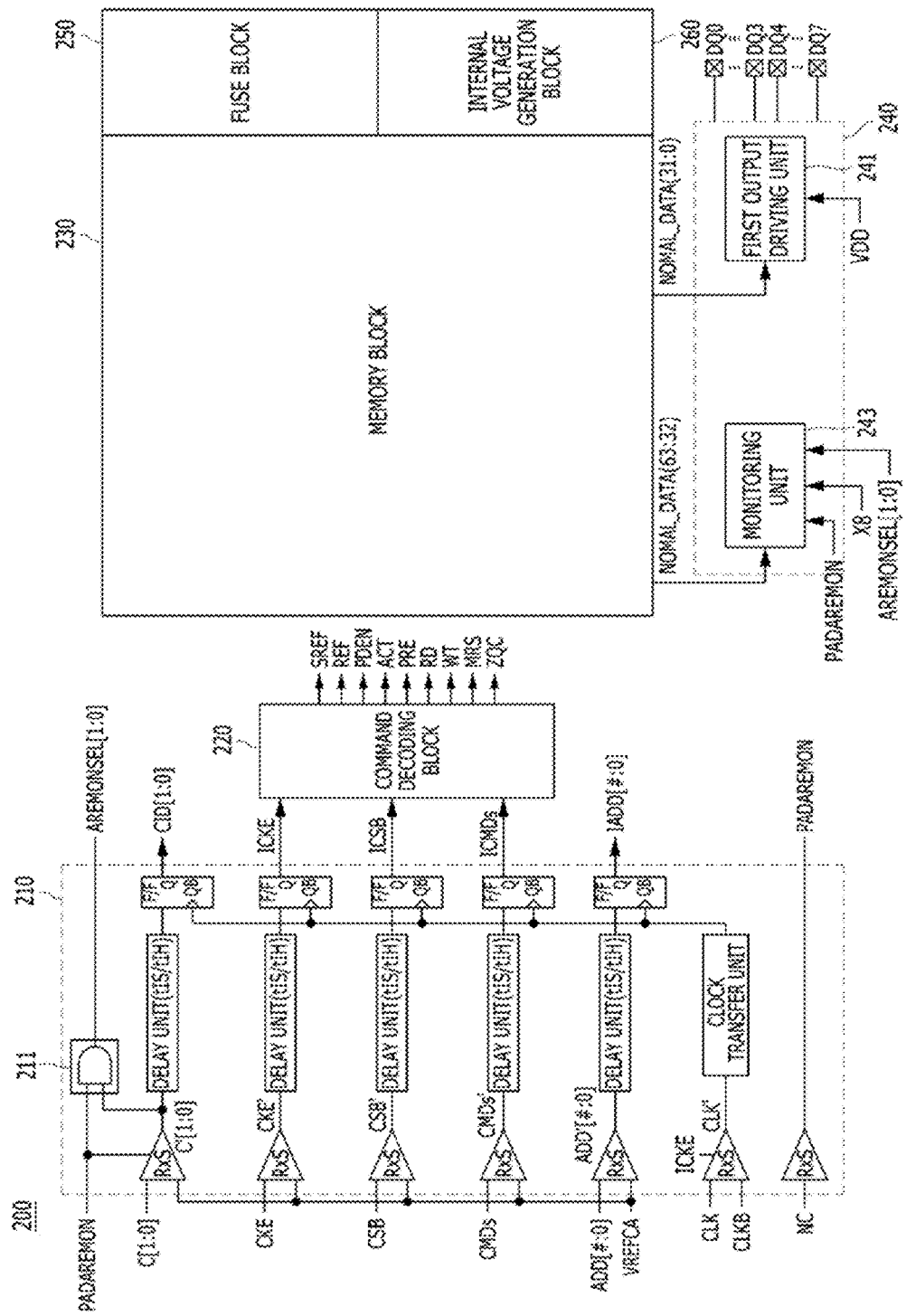
FIG. 3 is a block diagram illustrating a semiconductor device in accordance with an embodiment of the present invention.

FIG. 3 is a block diagram illustrating a semiconductor device 200 in accordance with an embodiment of the present invention.

Referring to FIG. 3, the semiconductor device 200 may include an internal signal processing block 210, a command decoding block 220, a memory block 230, an output block 240, a fuse block 250 that repairs the memory block 230, and an internal voltage generation block 260 that generates an internal voltage used for the operation of the memory block 230.

The internal signal processing block 210 generates internal signals AREMONSEL[1:0], CID[1:0], ICKE, ICSB, ICMDs, IADD[#:0], and PADAREMON in response to external signals C[1:0], CKE, CSB, CMOs, ADD[#:0], CLK, CLKB, and NC transferred from an external device (not illustrated). The command decoding block 220 decodes some ICKE, ICSB, and ICMDs of the signals generated from the internal signal processing block 210 and generates internal control signals SREF, REF, PDEN, ACT, PRE, RD, WT, MRS, ZQC, etc. The memory block 230 performs a write operation and a read operation in response to some IADD[#:0], etc of the signals generated from the internal signal processing block 210 and the signals ACT, PRE, RD, WT, etc. generated from the command decoding block 220. The output block 240 provides read data NOMAL_DATA [31:0] of a first group read from the memory block 230 to the external device through first to fourth data pads DQ0 to DQ3 and provides read data NOMAL_DATA[63:32] of a second group or monitoring signals ARESIG[3:0] (which will be described later) read from the memory block 230 to the external device through fifth to eighth data pads DQ4 to DQ7 in response to some AREMONSEL[1:0] and PADAREMON of the signals generated from the internal signal processing block 210 and a data width option signal X8.

The internal signal processing block 210 includes circuits for processing the external signals C[1:0], CKE, CSB, CMDs, ADD[#:0], CLK, CLKB, and NC according to internal characteristics. The external signals C[1:0], CKE, CSB, CMDs, ADD[#:0], CLK, CLKB, and NC include monitoring control signals C[1:0], a clock enable signal CKE, command signals CMDs, address signals ADD[#:0], differential clock signals CLK and CLKB, and a monitoring enable signal NC, wherein the external signals C[1:0], CKE, CSB, CMDs, ADD[#:0], CLK, CLKB, and NC will be named as the signals for this description. For reference, the chip identification signals may be used as the monitoring control signals C[1:0]

For example, the internal signal processing block 210 may include input units RxS, a clock transfer unit, delay units tIS/tIH, synchronization units F/F, and a monitoring control unit 211. The input units RxS buffer the monitoring control signals C[1:0], the clock enable signal CKE, the command signals CMDs, the address signals ADD[#:0], the differential clock signals CLK and CLKB, and the monitoring enable signal NC. The clock transfer unit transfers a clock signal CLK' of the signals outputted from the input units RxS to a predetermined path. The delay units tIS/tIH adjust the setup and hold times of pre-monitoring control signals C'[1:0], a pre-clock enable signal CKE', pre-command signals CMDs', and pre-address signals ADD'[#:0] of the signals outputted from the input units RxS. The synchronization units F/F synchronize signals outputted from the delay units tIS/tIH with an internal clock signal outputted from the clock transfer unit. The monitoring control unit 211 generates the internal monitoring control signals AREMONSEL[1:0] in response to the internal monitoring enable signal PADAREMON and the pre-monitoring control signals C'[1:0] of the signals outputted from the input units RxS.

Particularly, the input units RxS may include an input unit RxS that buffers the monitoring enable signal NC to generate the internal monitoring enable signal PADAREMON as described above. The input unit RxS, which generates the internal monitoring enable signal PADAREMON, may also be dedicated as an input unit for monitoring, or an unused input unit in terms of package characteristics may also be utilized. For example, among input units RxS for buffering the address signals ADD[4:0], there is an input unit not used according to the density of the memory block 230, wherein the input unit may be utilized as the input unit RxS that generates the internal monitoring enable signal PADAREMON.

Furthermore, the input units RxS may include an input unit RxS that buffers the monitoring control signals C[1:0] to generate the pre-monitoring control signals C'[1:0] as described above. The input unit RxS, which generates the pre-monitoring control signals C'[1:0], may also be dedicated as an input unit for monitoring, or an unused input unit in terms of package characteristics may also be utilized. For example, when the semiconductor device 200 is used as a single chip package, since an input unit for buffering a chip identification signal is not used, the input unit may be utilized as the input unit RxS for generating the pre-monitoring control signal's C'[1:0]. Furthermore, the input unit RxS for generating the pre-monitoring control signals C'[1:0] may be forcibly enabled by the internal monitoring enable signal PADAREMON.

Furthermore, the monitoring control unit 211 may output the pre-monitoring control signals C'[1:0] as the internal monitoring control signals AREMONSEL[1:0] only when the internal monitoring enable signal PADAREMON is activated. For example, the monitoring control unit 211 may include an OR gate.

The command decoding block 220 may combine some ICKE, ICSB, and ICMDs of the internal signals outputted from the internal signal processing block 210 with one another, and generate the internal control signals SREF, REF, PDEN, ACT, PRE, RD, WT, MRS, ZQC, etc.

The memory block 230 may output stored write data as the read data NOMAL_DATA[63:0] in a read operation. Particularly, the memory block 230 may decide the number of data to be outputted at a time according to a data width option mode. For example, the memory block 230 may simultaneously output the read data NOMAL_DATA[31:0] and NOMAL_DATA[63:32] of the first and second groups in an X8 mode, and may simultaneously output the read data NOMAL_DATA[31:0] of the first group between the read data NOMAL_DATA[31:0] and NOMAL_DATA[63:32] of the first and second groups in an X4 mode.

The output block 240 may include a first output driving unit 241 that outputs the first to $32^{th}$ read data NOMAL_DATA[31:0] to the first to fourth data pads DQ0 to DQ3, and a monitoring unit 243 that outputs the monitoring signals ARESIG[3:0] to the fifth to eighth data pads DQ4 to DQ7 for an initial operation period and outputs the monitoring signals ARESIG[3:0] or the $33^{th}$ to $64^{th}$ read data NOMAL_DATA[63:32] to the fifth to eighth data pads DQ4 to DQ7 for a normal operation period in response to the internal monitoring enable signal PADAREMON, the internal monitoring control signals AREMONSEL[1:0], and the data width option signal X8.

The initial operation period may include an initialization period and/or a boot-up period, which are subsequent to a power-up period. The power-up period may include a period in which a power supply voltage VDD is ramped to a target level. The initialization period is subsequent to the power-up period, and may include a period in which various logic circuits and the like are initialized. The boot-up period is subsequent to the initialization period, and may include a period in which all operations required when the semiconductor device 200 performs a normal operation for the normal operation period are performed. For example, the boot-up period may include a period in which the fuse block 250 loads fuse signals and the internal voltage generation block 260 generates an internal voltage.

Figure 4:
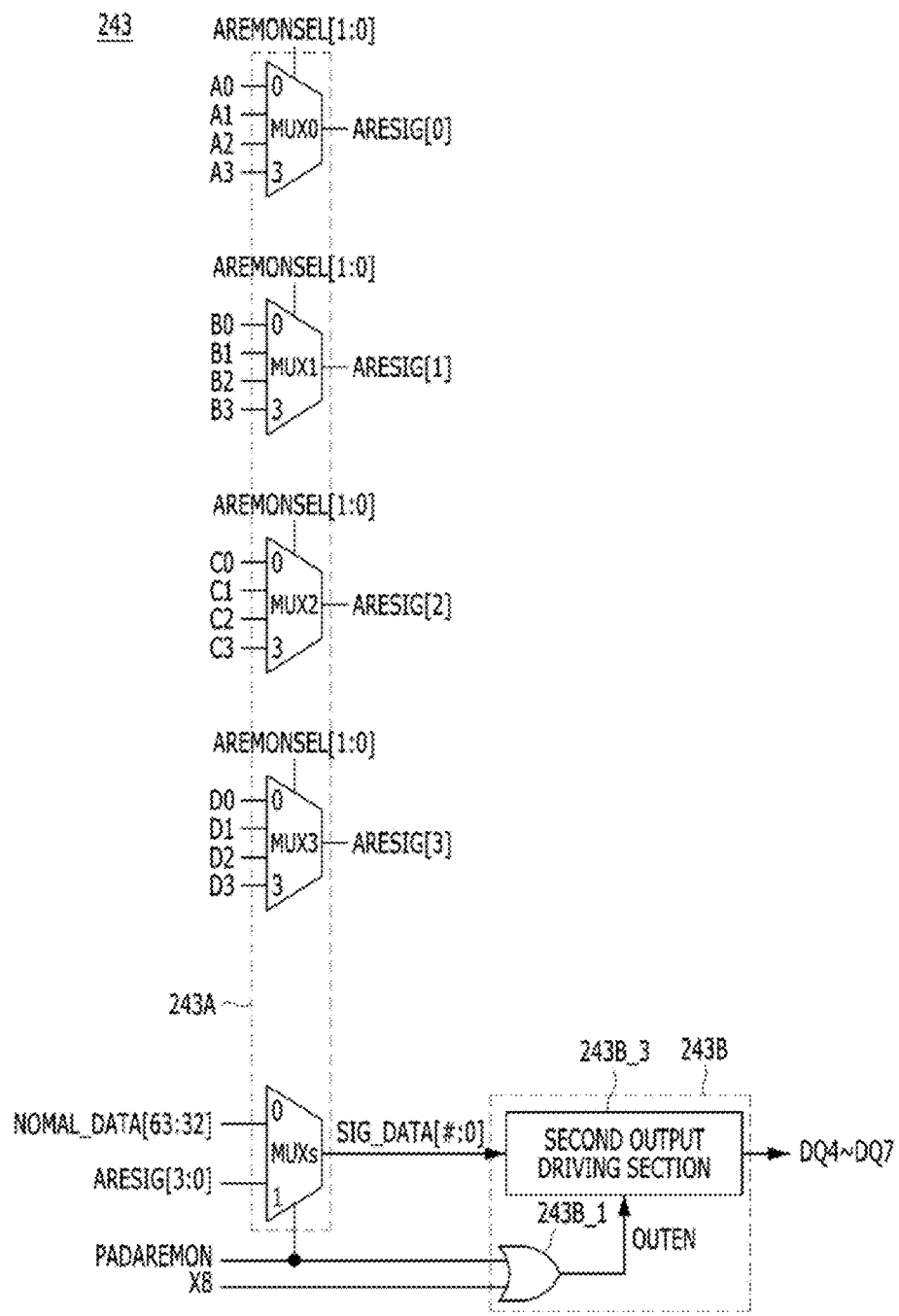
FIG. 4 is a detailed diagram of a monitoring unit illustrated in FIG. 3.

FIG. 4 is a detailed diagram of the monitoring unit 243 illustrated in FIG. 3.

Referring to FIG. 4, the monitoring unit 243 may include a selection circuit 243A and an output circuit 2436. The selection circuit 243A outputs the monitoring signals ARESIG[3:0] or the read data NOMAL_DATA[63:32] of the second group as pre-output signals SIG_DATA[#:0] according to the internal monitoring enable signal PADAREMON and the internal monitoring control signals AREMONSEL[1:0]. The output circuit 243B outputs the pre-output signals SIG_DATA[#:0] to the fifth to eighth data pads DQ4 to DQ7 according to the internal monitoring enable signal PADAREMON and the data width option signal X8.

The selection circuit 243A may include first selection sections MUX0 to MUX3 that sequentially output internal signals A0 to A3, B0 to B3, C0 to C3, and D0 to D3 needed to be monitored as the monitoring signals ARESIG[3:0] according to the internal monitoring control signals AREMONSEL[1:0], and a second selection section MUXs that outputs the monitoring signals ARESIG[3:0] or the read data NOMAL_DATA[63:32] of the second group as the pre-output signals SIG_DATA[#:0] according to the internal monitoring enable signal PADAREMON. The internal signals A0 to A3, B0 to B3, C0 to C3, and D0 to D3 needed to be monitored, for example, may include a power-up signal corresponding to the power-up period, a boot-up signal corresponding to the boot-up period, the fuse signals of the fuse block 250, an operation control signal for controlling the operation of the internal voltage generation block 260, and the like.

The output circuit 243B may include an output control section 243B_1 that generates an output control signal OUTEN according to the internal monitoring enable signal PADAREMON and the data width option signal X8 and a second output driving section 243B_3 that outputs the pre-output signals SIG_DATA[#:0] to the fifth to eighth data pads DQ4 to DQ7 according to the output control signal OUTEN. For example, the output control section 243B_1 may include an OR gate. The second output driving section 243B_3 may have substantially the same configuration as that of the first output driving unit 241, and may include a typical output driver. Such a second output driving section 243B_3 may function as a common output path together with the fifth to eighth data pads DQ4 to DQ7. This is because the second output driving section 243B_3 may substantially output the monitoring signals ARESIG[3:0] or the read data NOMAL_DATA[63:32] of the second group.

Hereinafter, an operation of the semiconductor device 200 shown in FIG. 3 will be described.

The operation of the semiconductor device 200 may include a first step in which the data width option mode of the semiconductor device 200 is set, a second step in which an external device (not illustrated) forcibly outputs the monitoring enable signal NC and the monitoring control signals C[1:0] to the semiconductor device 200 in a specific operation period in which the clock enable signal is in an undefined state or a deactivated state, a third step in which the semiconductor device 200 provides the external device with the monitoring signals ARESIG[3:0] through the fifth to eighth data pads DQ4 to DQ7 for the specific operation period according to the monitoring enable signal NC and the monitoring control signals C[1:0], and a fourth step in which the semiconductor device 200 provides the external device with the monitoring signals ARESIG[3:0] through the fifth to eighth data pads DQ4 to DQ7 according to the data width option signal X8 corresponding to the data width option mode, the monitoring enable signal NC, and the monitoring control signals C[1:0] in a normal operation period except for the specific operation period.

The first step may be performed in a test mode. In other words, in the test mode of the semiconductor device 200, a logic level of the data width option signal X8 corresponding to the data width option mode may be decided through a fuse program scheme and the like. For example, in order to set the data width option mode of the semiconductor device 200 as the 'X8 mode', the fuse program may be executed such that a data width option signal X8 of a logic high level is generated, and in order to set the data width option mode of the semiconductor device 200 as the 'X4 mode' the fuse program may be executed such that a data width option signal X8 of a logic low level is generated.

The second to fourth steps will be described in r more detail with reference to FIG. 5.

Figure 5:
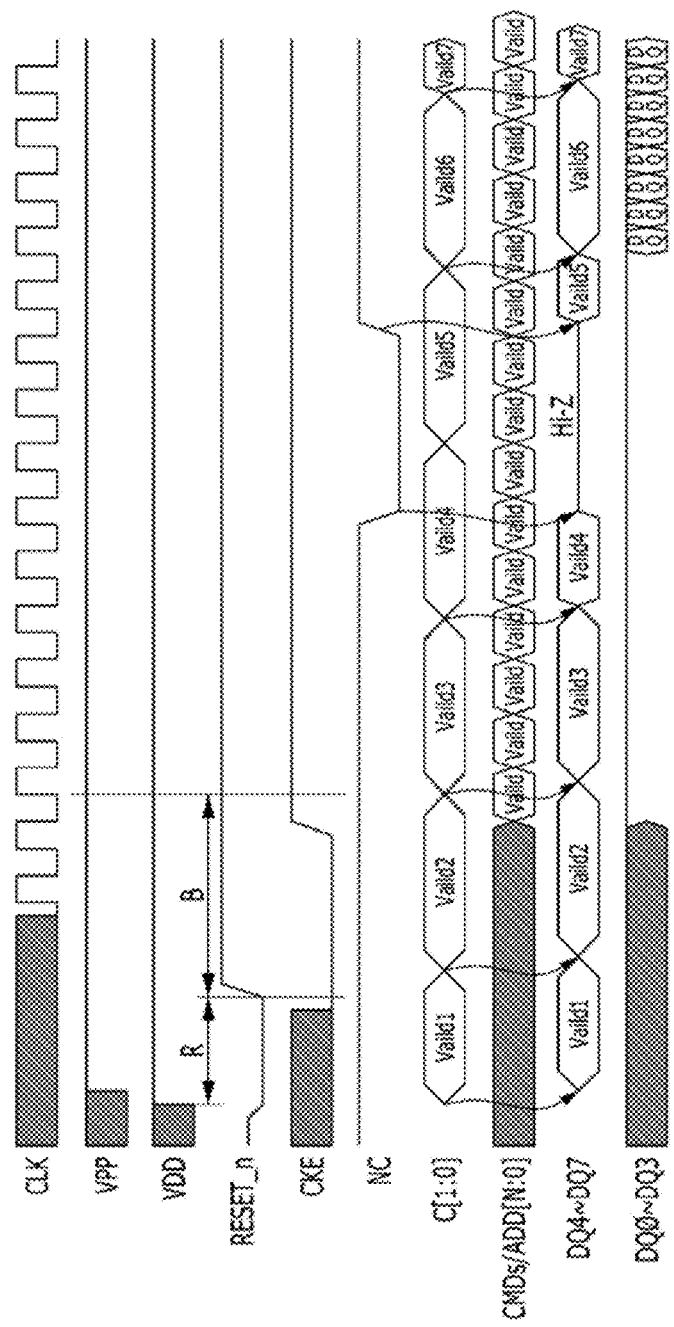
FIG. 5 is a timing diagram for describing an operation of the semiconductor device shown in FIG. 3.

FIG. 5 is a timing diagram for describing an operation of the semiconductor device 200 shown in FIG. 3.

Referring to FIG. 5, the second and third steps may be performed for the initialization period R in which the clock enable signal CKE is in an undefined state and the boot-up period B in which the clock enable signal CKE is in a deactivated state.

In more detail, the semiconductor device 200 performs the initialization operation for the initialization period R after the power-up period, and performs the boot-up operation for the boot-up period B after the initialization period R. For example, the semiconductor device 200 may initialize the logic values of logic circuits requiring the initialization operation for the initialization period R to a default value, load fuse signals programmed in the fuse block 250 for the boot-up period B, and generate an internal voltage through the internal voltage generation block 260.

The power-up period may include a period in which the power supply voltage VDD is ramped to a target level, the initialization period may include a period in which a reset signal RESET_n inputted from the external device is activated to a logic low level, and the boot-up period B may include a period from when the reset signal RESET_n is deactivated to a logic high level to when the clock enable signal CKE is activated to a logic high level.

Then, the semiconductor device 200 may provide the external device with the monitoring signals ARESIG[3:0] through the fifth to eighth data pads DQ4 to DQ7 for the initialization period R and the boot-up period B according to the monitoring enable signal NC and the monitoring control signals C[1:0]. For example, the semiconductor device 200 may perform a monitoring operation for the initialization period R and the boot-up period B according to the monitoring enable signal NC regardless of the data width option signal X8 and may sequentially output the internal signals A0 to A3, B0 to B3, C0 to C3, and D0 to D3 needed to be monitored to the fifth to eighth data pads DQ4 to DQ7 as the monitoring signals ARESIG[3:0] according to the internal monitoring control signals AREMONSEL[1:0] while the monitoring operation is being performed.

The internal signals A0 to A3, B0 to B3, C0 to C3, and D0 to D3 needed to be monitored, for example, may include the power-up signal corresponding to the power-up period, the boot-up signal corresponding to the boot-up period, the fuse signals of the fuse block 250, the operation control signal for controlling the operation of the internal voltage generation block 260, and the like.

Furthermore, since all configurations including the input units RxS may operate from the time point at which the power-up period is ended, the semiconductor device 200 may perform the monitoring operation for the initialization period R and the boot-up period B according to the monitoring enable signal NC and the monitoring control signals C[1:0] outputted from the external device.

Subsequently, the semiconductor device 200 may perform a predetermined operation for a normal period after the boot-up period B in response to the command signals CMDs and the address signals ADD[#:0].

For example, the semiconductor device 200 may substantially receive the command signals CMDs and the address signals ADD[#:0] from the time point at which the dock enable signal CKE is activated to a logic high level, and may output the first to $32^{th}$ read data NOMAL_DATA[31:0] to the external device through the first to fourth data pads DQ0 to DQ3 for the normal period in response to the command signals CMDs and the address signals ADD[#:0].

When the data width option mode is set as the 'X4' mode, for example, when the data width option signal X8 is deactivated, the semiconductor device 200 may provide the external device with the monitoring signals ARESIG[3:0] through the fifth to eighth data pads DQ4 to DQ7 for the normal period according to the monitoring enable signal NC and the monitoring control signals C[1:0].

Although not illustrated in the drawing, when the data width option mode is set as the 'X8' mode, for example, when the data width option signal X8 is activated, the semiconductor device 200 may output the read data NOMAL_DATA[63:32] of the second group to the external device through the fifth to eighth data pads DQ4 to DQ7 for the normal period according to the command signals CMDs and the address signals ADD[#:0].

In accordance with an embodiment of the present invention as described above, internal signals related to the initialization operation and the boot-up operation may be monitored for the initialization period and the boot-up period. Furthermore, it may be possible to utilize unused pads and circuits as a configuration for monitoring the internal signals related to the initialization operation and the boot-up operation in the normal operation.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   an internal signal processing block generating an internal enable signal and an internal control signal that are asynchronized with a clock signal according to an external enable signal and an external control signal; and
   a monitoring unit outputting a monitoring signal that corresponds to a predetermined internal signal, based on the internal enable signal and the internal control signal, in a specific operation period,
   wherein the specific operation period includes a period in which a clock enable signal is in an undefined state or a deactivated state, and
   wherein the clock enable signal includes a signal for controlling the input of the clock signal.

2. The semiconductor device of claim 1, wherein the specific operation period includes an initialization period and/or a boot-up period, which are subsequent to a power-up period.

3. The semiconductor device of claim 1, further comprising:
an internal voltage generation block generating an internal voltage corresponding to an operation control signal, wherein the internal voltage generation block is initialized based on a power-up signal; and
a fuse block outputting a predetermined fuse signal based on a boot-up signal,
wherein the predetermined internal signal includes one of the power-up signal, the operation control signal, the boot-up signal, and the fuse signal.

4. The semiconductor device of claim 1, wherein the monitoring unit outputs the monitoring signal based on the internal enable signal and the internal control signal, in a normal operation period after the specific operation period.

5. A semiconductor device comprising:
a first pad selectively outputting a monitoring signal and a data signal, wherein the data signal is generated according to one or more signals asynchronized with a clock signal; and
a monitoring unit outputting a first internal signal to be monitored as the monitoring signal, in a specific operation period,
wherein the specific operation period includes a period in which a clock enable signal is in an undefined state or a deactivated state, and
wherein the clock enable signal includes a signal for controlling the input of the clock signal.

6. The semiconductor device of claim 5, wherein the specific operation period includes an initialization period and/or a boot-up period, which are subsequent to a power-up period.

7. The semiconductor device of claim 5, wherein the monitoring unit outputs the monitoring signal to the pad or outputs the data signal corresponding to a second internal signal to the pad based on a data width option signal, in a normal operation period after the specific operation period.

8. The semiconductor device of claim 7, further comprising:
a memory block,
wherein the second internal signal includes a data signal stored in the memory block.

9. The semiconductor device of claim 7, further comprising:
a second pad receiving an external enable signal;
at least one third pad receiving at least one external control signal; and
an internal signal processing block generating an internal enable signal and an internal control signal that correspond to the external enable signal and the external control signal.

10. The semiconductor device of claim 9, wherein the monitoring unit comprises:
a selection circuit selecting any one of the first and second internal signals based on the internal enable signal and the internal control signal, and generating a pre-output signal; and
an output circuit outputting the pre-output signal as the monitoring signal or the data signal based on the internal enable signal and the data width option signal.

11. The semiconductor device of claim 10, wherein the first internal signal includes internal signals, and the selection circuit comprises:

a first selection section sequentially outputting the internal signals as an internal output signal based on the internal control signal; and
a second selection section selecting any one of the internal output signal and the second internal signal based on the internal enable signal, to output the selected signal as the pre-output signal.

12. The semiconductor device of claim 10, wherein the output circuit comprises:
an output control section generating an output control signal based on the internal enable signal and the data width option signal; and
an output driving section outputting the pre-output signal as the monitoring signal or the data signal based on the output control signal.

13. The semiconductor device of claim 9, wherein the internal signal processing block comprises:
a first buffer unit buffering the external enable signal to generate the internal enable signal;
a second buffer unit buffering the external control signal to generate a pre-control signal; and
an internal operation signal processing unit outputting the pre-control signal as the internal control signal based on the internal enable signal.

14. The semiconductor device of claim 5, further comprising:
an internal voltage generation block generating an internal voltage based on an operation control signal, wherein the internal voltage generation block is initialized based on a power-up signal; and
a fuse block outputting a predetermined fuse signal based on a boot-up signal,
wherein the first internal signal includes one of the power-up signal, the operation control signal, the boot-up signal, and the fuse signal.

15. A method for driving a semiconductor device, comprising:
receiving an external enable signal and an external control signal asynchronized with a clock signal in a specific operation period in which a clock enable signal is in an undefined state or a deactivated state, wherein the clock enable signal includes a signal for controlling the input of the clock signal; and
outputting a monitoring signal that corresponds to an internal signal based on the external enable signal and the external control signal, in the specific operation period.

16. The method of claim 15, wherein the specific operation period includes an initialization operation and/or a boot-up operation, and
the internal signal relates to one of the initialization operation and the boot-up operation.

17. The method of claim 15, further comprising:
setting a data width option mode; and
selectively outputting the monitoring signal and a data signal through a common output path based on the data width option mode, in a normal operation period other than the specific operation period.

18. The method of claim 17, wherein, when the data width option mode is set to have a maximum data width, the semiconductor device outputs the data signal through the common output path, in the normal operation period.

19. The method of claim 17, wherein, when the data width option mode is set to have a non-maximum data width, the semiconductor device outputs the monitoring signal through the common output path, in the normal operation period.

20. The method of claim 17, wherein the semiconductor device outputs the monitoring signal through the common output path in the specific operation period.

\* \* \* \* \*